United States Patent [19]

Nillesen

[11] Patent Number: 5,625,581

[45] Date of Patent: Apr. 29, 1997

[54] NON-INTEGRAL DELAY CIRCUIT

[75] Inventor: Antonius H. H. J. Nillesen, Eindhoven, Netherlands

[73] Assignee: U.S. Philips Corporation, New York, N.Y.

[21] Appl. No.: 340,570

[22] Filed: Nov. 16, 1994

[30] Foreign Application Priority Data

Dec. 24, 1993 [BE] Belgium ................... 09301458

[51] Int. Cl.⁶ .................................................. G06F 17/10
[52] U.S. Cl. ........................... 364/724.01; 364/724.13
[58] Field of Search .................. 364/715.01, 724.01, 364/724.03, 724.1, 724.16, 724.17, 724.13

[56] References Cited

U.S. PATENT DOCUMENTS

| | | | |
|---|---|---|---|
| 4,285,045 | 8/1981 | Tamori et al. ............... | 364/724.01 |
| 4,497,035 | 1/1985 | Yabuuchi et al. ............... | 364/577 |
| 4,694,414 | 9/1987 | Christopher ............... | 364/724.1 |
| 4,760,542 | 7/1988 | Mehrgardt et al. ............... | 364/724.01 |
| 4,866,647 | 9/1989 | Farrow ............... | 364/724.1 |
| 5,245,127 | 9/1993 | Yamauchi et al. ............... | 84/624 |

*Primary Examiner*—Roy N. Envall, Jr.
*Assistant Examiner*—Chuong D. Ngo
*Attorney, Agent, or Firm*—Bernard Franzblau

[57] ABSTRACT

A time-discrete signal is delayed by a selectable fraction ($\delta$) of a sampling period of the time-discrete signal. First (F1) and second (F2) differential signals having mutually different phase characteristics are derived from the time-discrete signal and are subsequently combined (MIX) dependent upon the selectable fraction ($\delta$) to obtain a phase-adjusted correction signal. The product of the selectable fraction ($\delta$) and the correction signal is added to the time-discrete signal to obtain a time-discrete signal which has been delayed by the selectable fraction ($\delta$). The second differential signal is obtained by means of a differentiator with asymmetric coefficients in order to optimise the transfer characteristic for $\delta=0.5$.

7 Claims, 10 Drawing Sheets

NON-INTEGRAL DELAY CIRCUIT

BACKGROUND OF THE INVENTION

This invention relates to a method of and a device for obtaining a non-integral delay, i.e. a delay of a signal by a time interval equal to a fraction of a clock period.

The non-prepublished European Patent Application no. 92.201.894.0, filed on Jun. 26, 1993, which corresponds to U.S. Pat. No. 5,349,548, and which together with the Applications corresponding thereto is herewith incorporated by reference, describes a Variable Phase Delay (VPD) FIR filter which can be used to shift a time-discrete signal in time. The phase delay can then be any arbitrary traction of a sampling period Ts. Such a variable delay is required, for example, to convert the signal to another sampling frequency Fs. The transfer function Fvpd of the VPD filter is:

Fvpd=F0+δ*[δ*F1+(1−δ)*sign*F2], where:

F0=low-pass-filtered (LPF) signal

F1=Sn−F0=first differential signal

Sn=nearest sample

F2=second differential signal

δ=shift relative to the centre of the sampling period, expressed with regard to 50% of a sampling period sign=sign of the shift relative to Sn FIGS. 1 and 2 show two embodiments, i.e. the VPD10 filter (with 10 delay sections $Z^{-1}$) and the VPD04 filter (with 4delay sections), respectively, together with a resulting interpolation characteristic (gain G versus frequency in multiples of the sampling frequency Fs) for a delay by a δ=n/4 for n=−4..3 of a sampling period, which results in an interpolation yielding a signal sampled at 8*Fs. The timeshift δ is related to 50% of the sampling period because, starting from a minimum delay of half a sampling period, each delay can be realised by varying δ and, if necessary, adding a variable number of integer delay section. The shadow ranges in the interpolation characteristic are situated within bandwidths of ⅜*Fs around multiples of the sampling frequency Fs. The impulse response of the VPD10 filter, in the case of conversion to a substantially higher sampling frequency (small increment of delta), is shown in FIG. 3, together with the control signals sign(δ) and δ.

If a VPD-filter is to be used for vertical interpolation of TV pictures (for example, in standard conversion for matrix display) the problem arises that a unit delay consists of a line memory which is substantially larger than the required adders and/or multipliers. This means that it is then preferable to opt for a short delay network (for example VPD04) and, if need be, to use more hardware for further processing. Moreover, a vertical prefilter would also require line memories so that it is preferred to have an interpolation filter having a "flatter" stop band and, consequently, slightly lower peaks around multiples of the transition band. Cf. around (N+0.5)*Fs in the characteristic shown in FIG. 2B.

For use in conjunction with audio signals and composite video signals, a smaller ripple would be desirable throughout the characteristic, particularly in the pass band and at harmonics thereof (around N*Fs, where Fs is the sampling frequency).

It is one of the objects of the invention to provide a non-integral delay circuit which meets at least some of the above-mentioned drawbacks and/or requirements. To this end, a first aspect of the invention provides a non-integral delay circuit as defined in Claim 1. A second aspect of the invention provides for a method as defined in Claim 7. Advantageous embodiments are defined in the dependent Claims.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

Figure 4A:
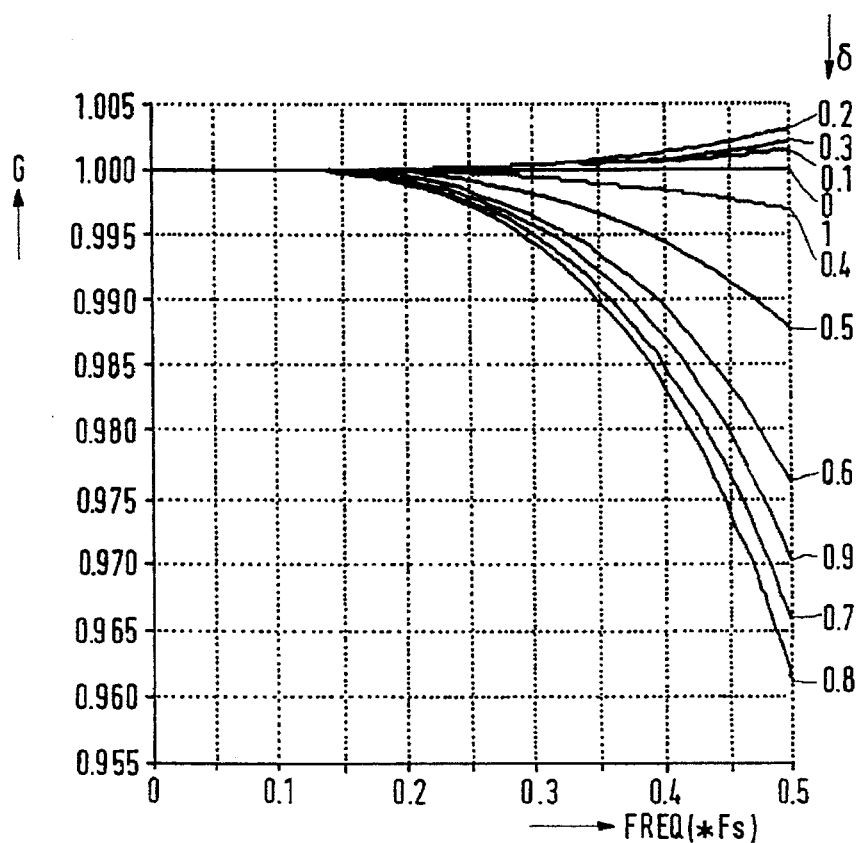
FIGS. 4A and 4B shows transfer characteristics (gain G versus relative frequency and phase delay PD versus relative frequency) of a variable phase delay filter with ideal subfilters.
Figure 4B:
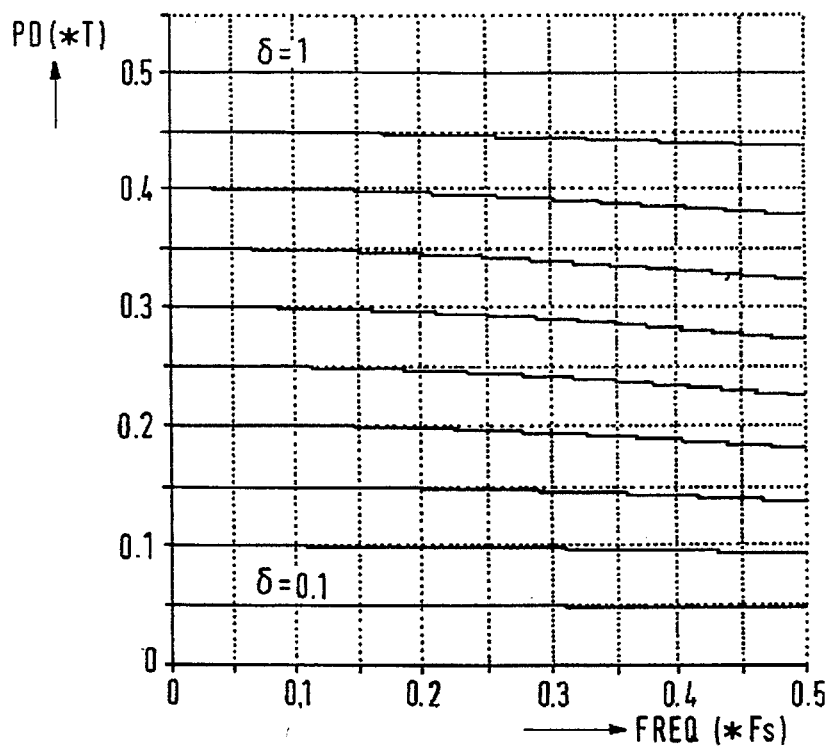

The variable phase delay filter (VPD) described in the non-prepublished European Patent Application no. 92.201.894.0, filed on Jun. 26, 1993, which together with the Applications corresponding thereto is herewith incorporated by reference, exhibits an ideal behaviour for δ=0 and for δ=1 independently of the differentiated signal F2. Fvpd(δ=0)=F0 and Fvdp(δ=1)=Sn. F0 and Sn are "ideal" for they both exhibit a linear phase characteristic. Indeed, F0 is the result of filtering with symmetric coefficients and Sn is the non-filtered signal. Since F2 has no influence for δ=0 and δ=1, it is better to optimise F2 for another value of δ. For this, the transfer characteristics of the VPD filter in the case of ideal sub-filters are considered, as is shown in FIGS. 4A and 4B. An error reduction can be obtained if the characteristics are not only made zero for δ=0 and δ=1 but are also minimised for δ=0.5. This can be achieved by designing the differentiator D for supplying the second differential signal F2 for δ=0.5 rather than for δ=0.

Step 1: This requires a differentiator with asymmetric instead of anti-symmetric coefficients.

Since the phase error for a shift of −0.5 is opposed to the error for a shift of +0.5, the asymmetry should be reversed for negative shifts.

Step 2: The sequence of the differentiator coefficients should be reversed with the sign of the shift δ.

Figure 5:
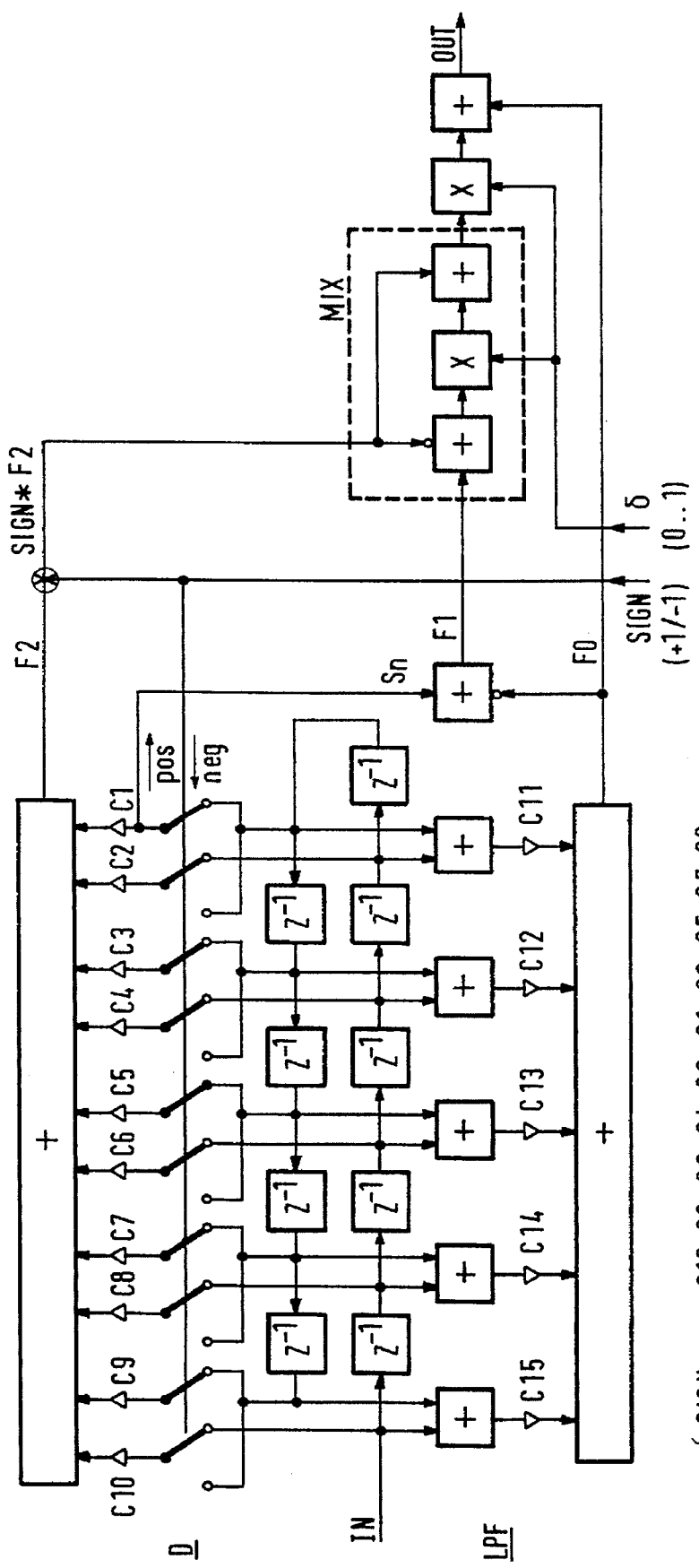
FIG. 5 shows a first embodiment of a variable phase delay filter in accordance with the invention, with multiplexer coefficients in the differentiator D for supplying differential signal F2.

A block diagram for such a VPD10 filter in accordance with the invention is shown in FIG. 5, together with the impulse response of the differentiator D for a positive and a negative sign of the shift δ.

Figure 3:
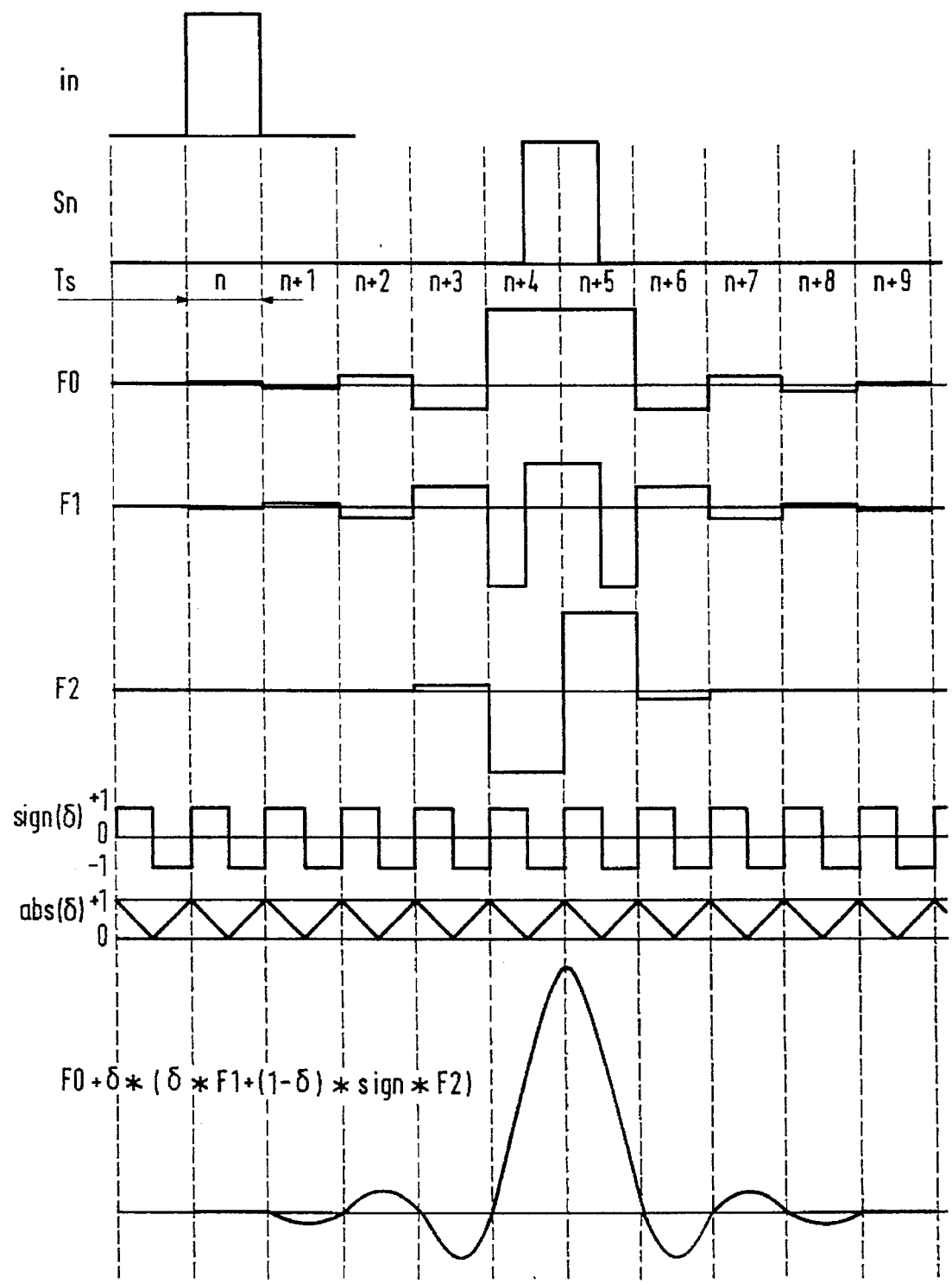
FIG. 3 shows some signal waveforms appearing in the first embodiment shown in FIG. 1 when a unit impulse is applied together with control signals for conversion to a substantially higher sampling frequency with small increments of the delay δ.
Figure 6:
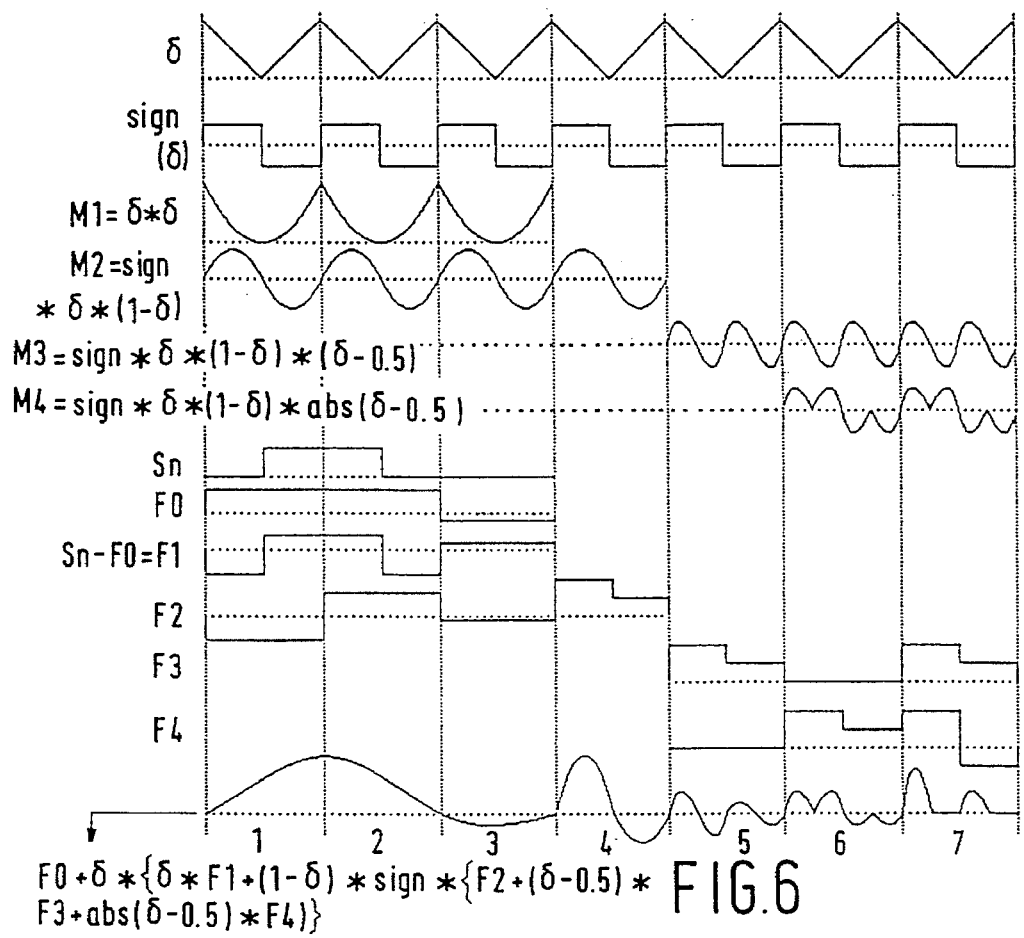
FIG. 6 shows some signal waveforms in the time domain occurring in variable phase delay filters.

Further improvement is possible by:

Step 3: Adding additional differentiators with other control functions. For this the operation of the VPD filter is considered in the time domain with reference to FIG. 6. Columns 1..3 of FIG. 6 give the signals of the sampling periods n+4..n+6 of FIG. 3 together with the functions M1=δ*δ and M2=sign*δ*(1−δ) by which F1 and F2 are multiplied, respectively. The factor δ*(1−δ) is a periodic parabola which after multiplication by the sign bears a close resemblance to a sinewave having a frequency equal to the sampling frequency, which is eventually modulated with F2. Column 4 shows that a more elaborate modulation of the F2 factor M2=sign*δ*(1−δ) is possible if other coefficients are chosen when the sign changes. Since the F2 factor M2 is zero for δ=0 and δ=1, the response can be optimised for δ=0.5 and sign=±1 with the aid of F2 without the result for δ=0 and δ=1 being influenced. Obviously, this is not essential but it facilitates the design. In order to improve the response for other values of δ, a differentiator may be added whose result (F3) is multiplied by a function M3 which is non-zero for these other values of δ. It would be convenient if this function were zero for the values of the delay δ already discussed. It is possible, for example, to take the square of the absolute value of δ−0.5, which yields a parabola of twice the frequency with zero points for δ=N/2. However, it is simpler to start from the F2 factor and to multiply this factor by (δ−0.5). This F3 factor M3 and the result of modulation by this factor is indicated in column 5 of FIG. 6.

A further improvement can be obtained by adding another differentiator (F4) whose result is multiplied by the absolute value of (δ−0.5), which is subsequently added to F2 and is then also multiplied by the F2 factor. Thus, the differential signal F4 is multiplied by M4=sign*δ*(1−δ)*abs(δ−0.5). Column 6 of FIG. 6 gives an example of the contribution of F4, and column 7 shows that with the combination of F3 and F4 the response can be selected independently for four additional shift values.

Step 3b: Take the control functions (δ−0.5) and abs(δ−0.5), respectively, for the two following differentiators, and add the result to F2 for further processing in the mixer.

Figure 7:
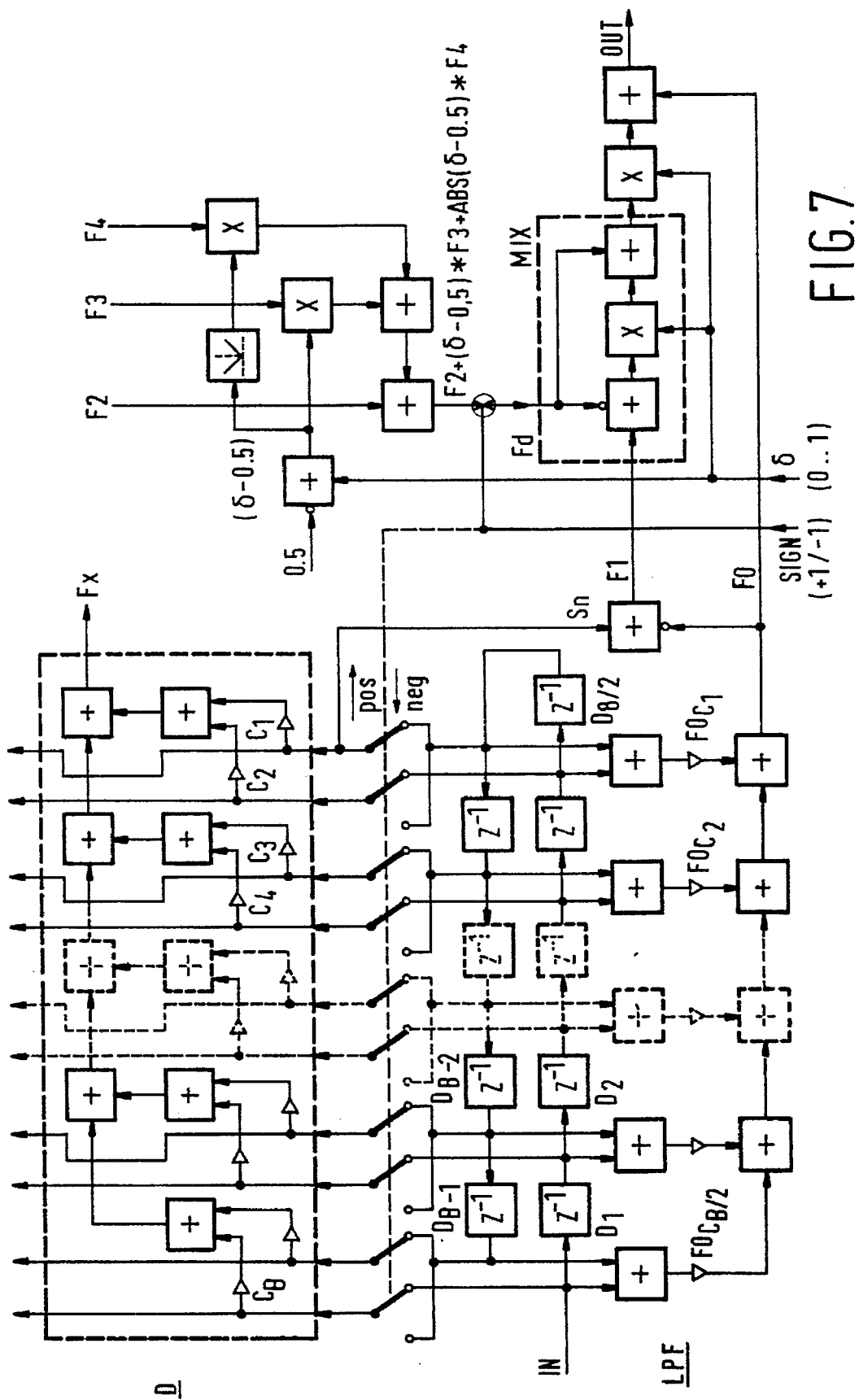
FIG. 7 shows a second embodiment of a variable phase delay filter in accordance with the invention, with B taps of the delay network.

FIG. 7 shows the resulting block diagram. This diagram shows only one differentiator having an output Fx. Each differentiator is of the same construction but has other coefficients C1..CB, where B is the number of taps of the delay network. The parts to be added or removed in order to change the length of the VPD filter in accordance with the invention are shown in broken lines.

Figure 8:
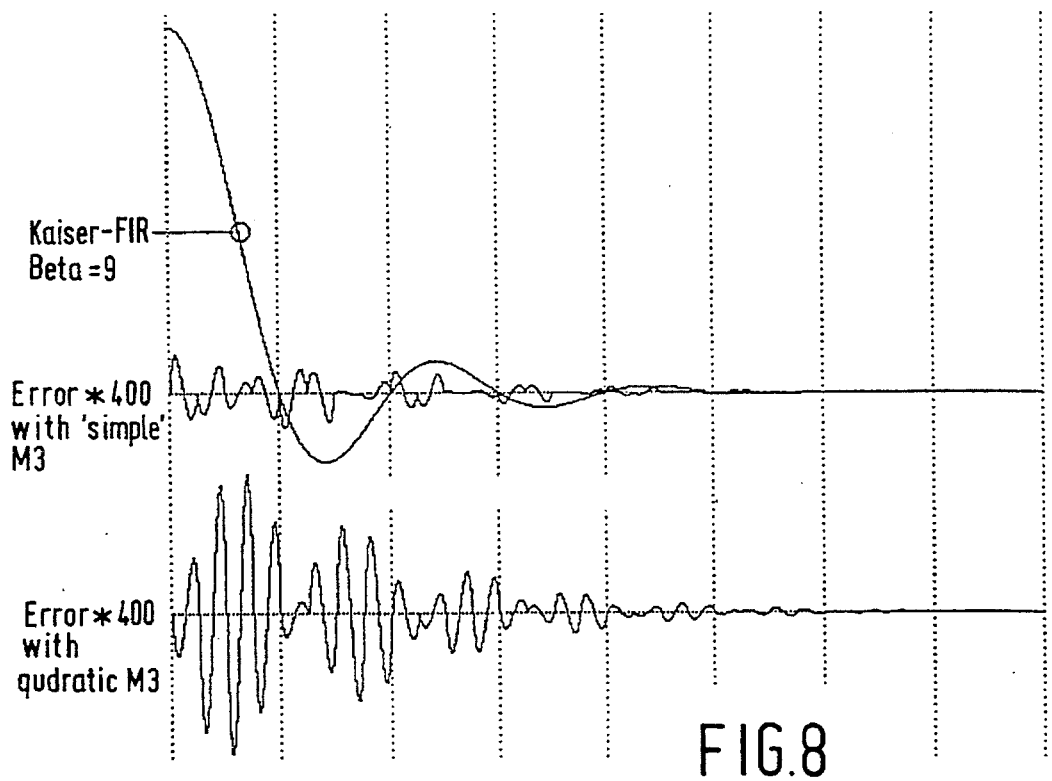
FIG. 8 illustrates an error in the impulse response of a variable phase delay filter in accordance with the invention, comprising 16 delay sections with a simple and with a purely quadratic factor M3.

FIG. 8 shows that the result with the simple F3 and F4 factors is even better than with purely quadratic control functions. The error is zero for multiples of ⅛ of the sampling period Ts. To optimise the control functions, but also if only a few values of delta are used, it may be advantageous not to compute the control functions but to select them from a number of fixed values with the aid of a multiplexer or ROM. For example, if a VPD filter is used for 4*upsampling, only 4 values of delta are required: 0, ±½ and 1. Complete parametrisation and mixing of the functions is then reduced to some multiplexed adders.

Step 4: For optimisation the control function can be implemented by selection from a number of fixed possibilities by means of a table (ROM) or multiplexer, with the shift as a parameter.

Obviously, further improvement is possible with even more differentiators in conjunction with higher-order control functions, but the said functions F2..F4 with the associated control functions already prove to be adequate in order to provide reductions of the distortion of better than −60 dB. In principle, the sub-filters can also be given odd lengths with δ adjusted etc. However, this leads to less simple versions.

Optimising differentiators for δ=0.5 etc., which requires multiplexed taps of the delay sections, and adding further differentiators with separate control signals are two separate steps, which may each provide improvement. This will be demonstrated by means of FIG. 9.

The embodiments are based on the diagram shown in FIG. 7. Only the coefficients will be given with interpolation characteristics. In the lists of coefficients Fxcdiv (x=0..4) is the number by which the coefficients Fxc are to be divided. In the examples, Fxcdiv is a power of 2 and the coefficients are given as integers. This means that the coefficients in the examples have been quantised, which renders the examples suitable for direct digital implementation.

Figure 1A:
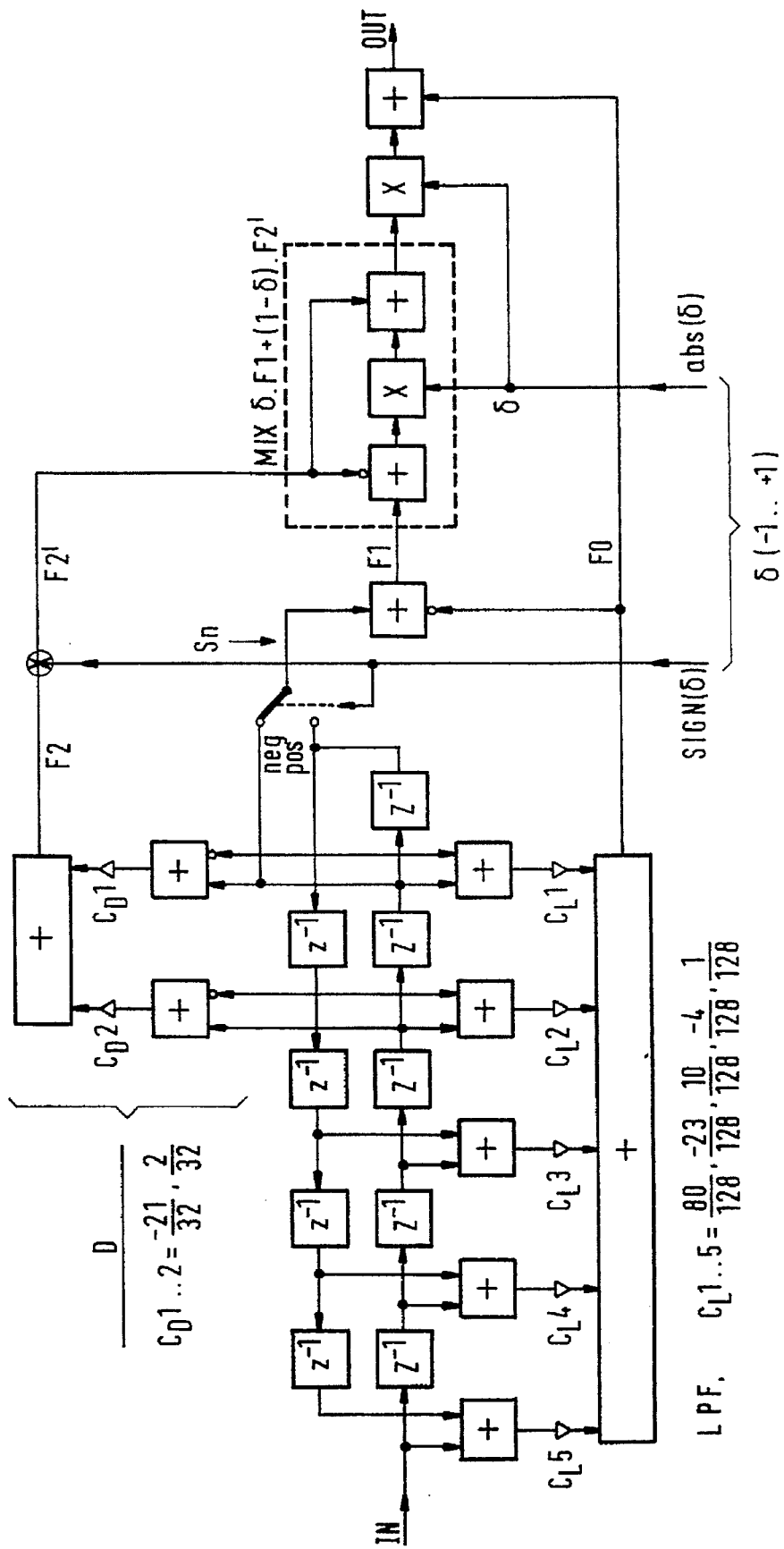
FIGS. 1a and 1B shows a first embodiment with interpolation characteristic of a non-integral delay circuit (VDP filter) of a type already described having 10 delay sections.
Figure 1B:
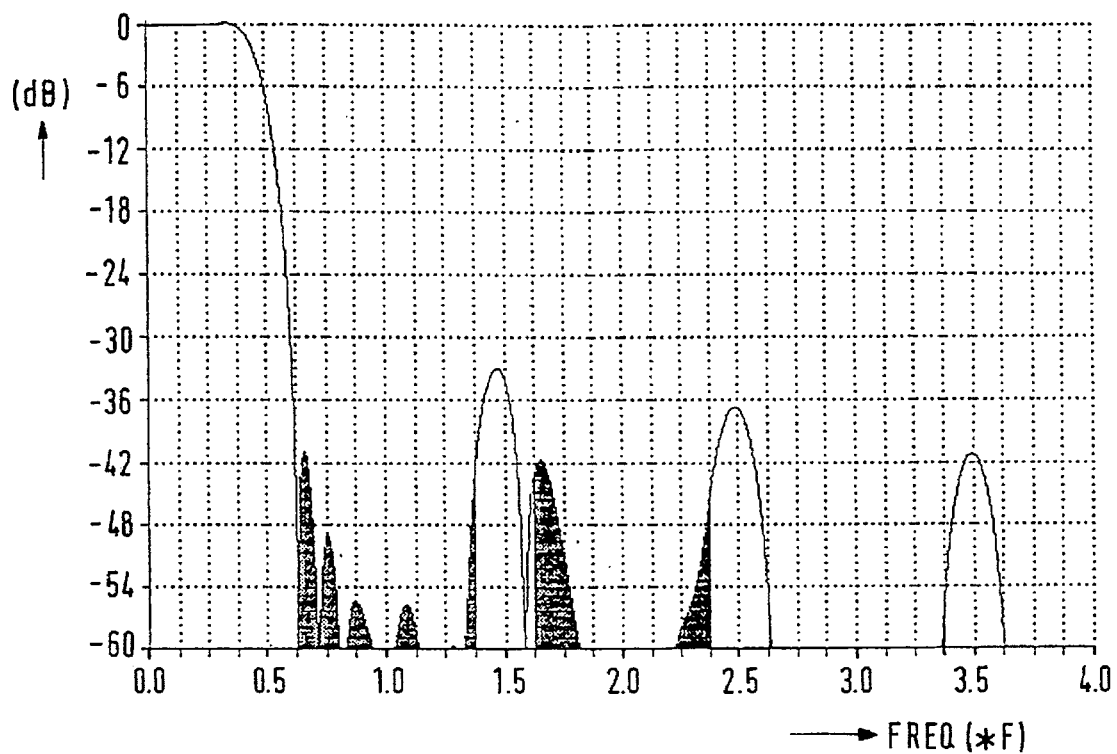
Figure 2B:
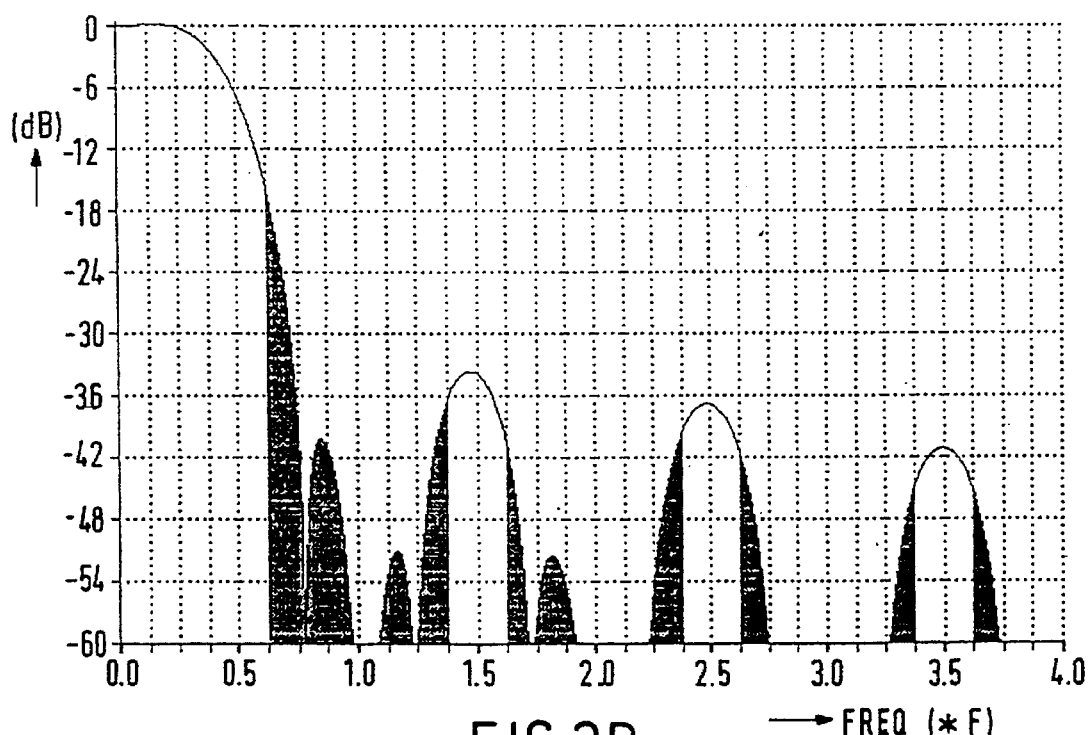
FIGS. 2a and 2B shows a second embodiment with interpolation characteristic of a non-integral delay circuit (VDP filter) of a type already described having 4 delay sections.
Figure 2A:
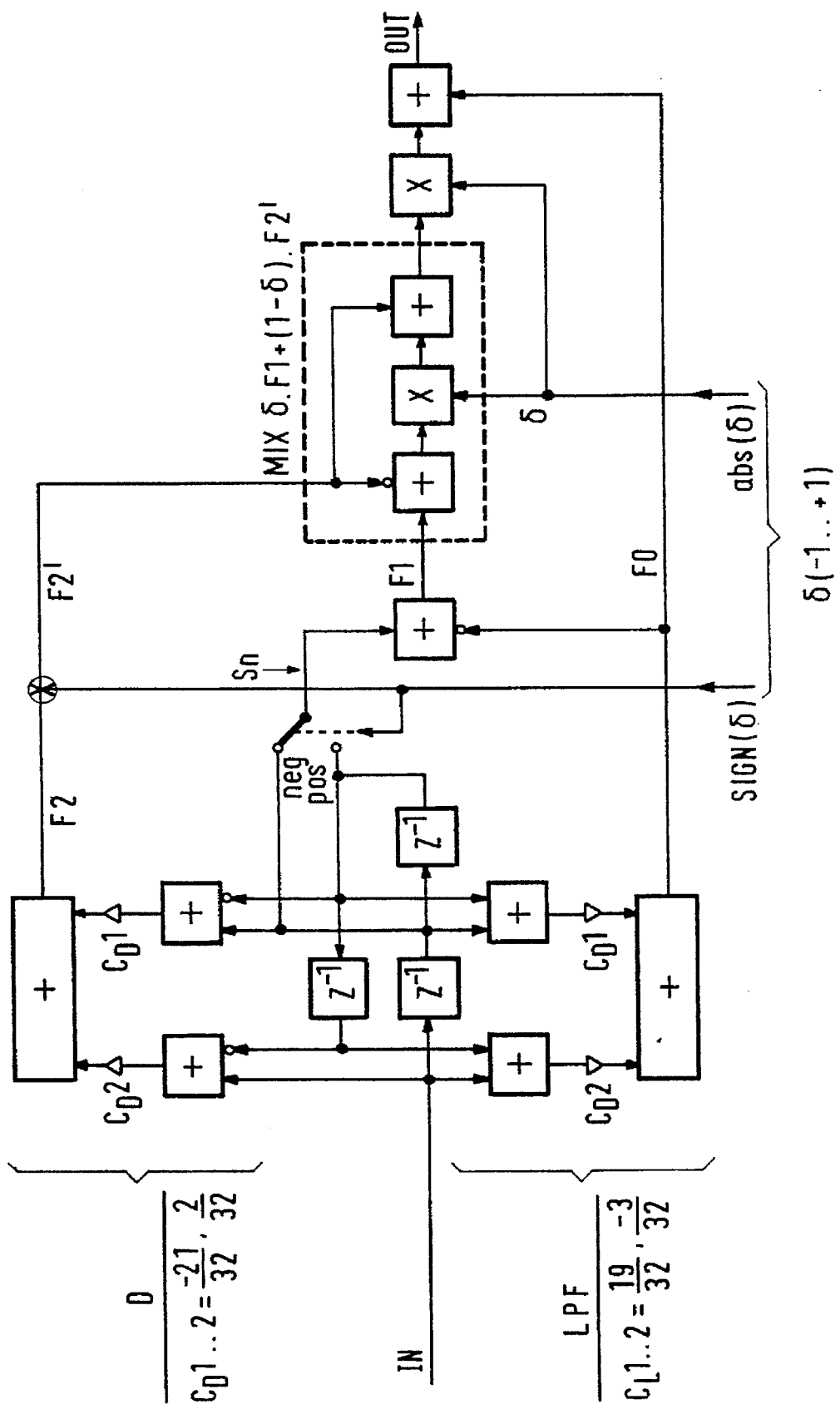
Figure 9:
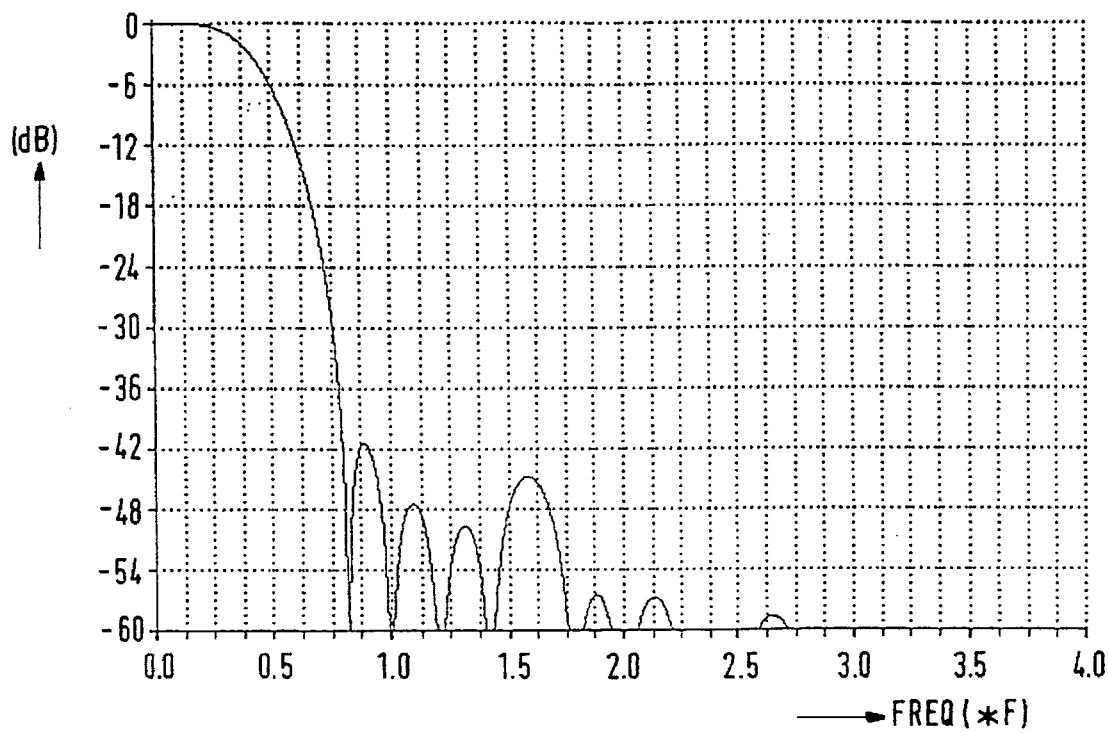
FIG. 9 shows an interpolation characteristic for obtaining an interpolated signal sampled at 8*Fs with δ=n/4 of a simplified variable phase delay filter in accordance with the invention, comprising four delay sections.
Figure 10:
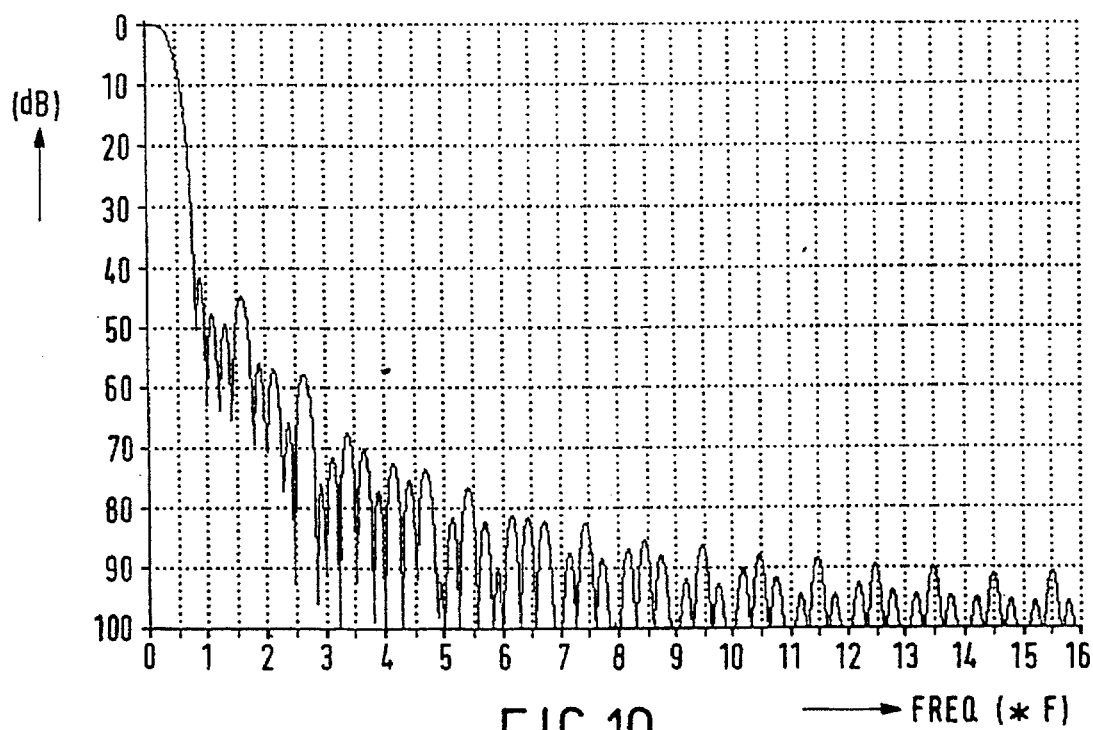
FIG. 10 shows an interpolation characteristic for obtaining an interpolated signal sampled at 32*Fs with δ=n/16, of a simplified variable phase delay filter in accordance with the invention, comprising four delay sections.

FIG. 9 shows the interpolation characteristics of a VPD04 filter in accordance with the invention (without multiplexer) for a delay δ of ⅛. The coefficients of the low-pass filter LPF are F0cdiv=64, F0c=(37,−5). The coefficients of the differentiators are F2cdiv=64, F2c=(49,49,−8,−8), F3cdiv=32, F3c=(5,5,−3,−3). Comparison with FIG. 2 shows a substantial improvement, particularly for harmonics of the transition band. In this VPD filter, only the function F3 has been added. Indeed, the coefficients of the differentiators are identical in pairs so that the multiplexer shown in FIG. 5 is not required. Nevertheless, the approximation to the desired response is very satisfactory, as will be apparent from FIG. 10 which shows the interpolation characteristic for obtaining an interpolated signal sampled at 32*Fs.

Figure 11:
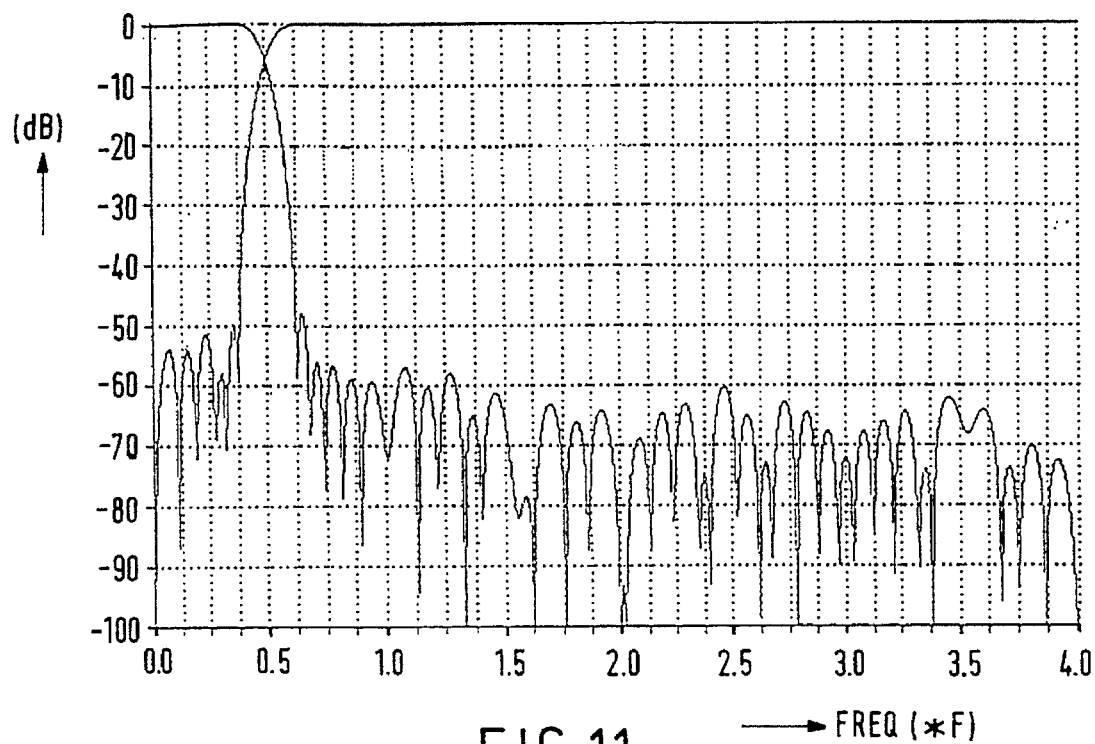
FIG. 11 shows an interpolation characteristic for obtaining an interpolated signal sampled at 8*Fs with δ=n/4, of a variable phase delay filter in accordance with the invention, comprising twelve delay sections.
Figure 12:
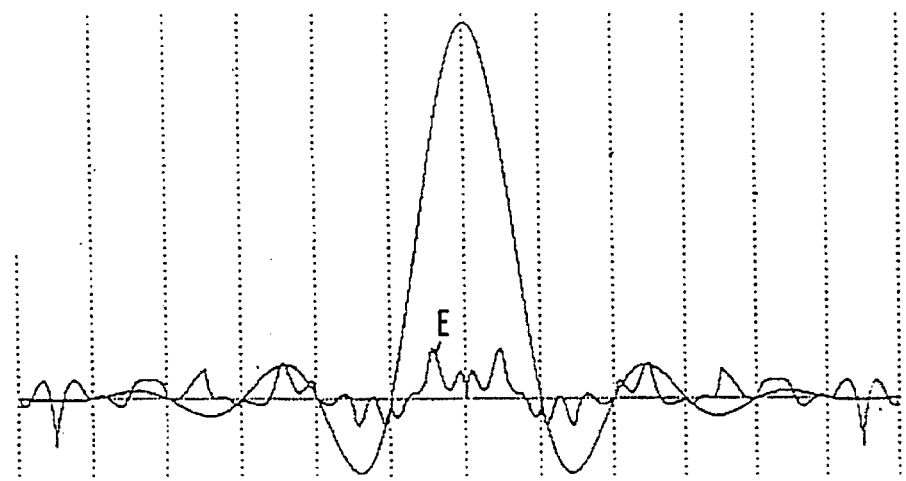
FIG. 12 illustrates an error in the impulse response of the variable phase delay filter in accordance with the invention, comprising twelve delay sections.

FIG. 11 shows the interpolation characteristic for obtaining an interpolated signal sampled at 8*Fs, of a VPD filter in accordance with the invention with 12 delay sections and the following coefficients. The coefficients of the low-pass filter LPF are F0cdiv=256, F0c=(161, −48, 23, −11, 5, −2). The coefficients of the differentiators are F2cdiv=256, F2c= (180, 185, −25, −33, 8, 15, −5, −7, 3, 4, 0, −3), F3cdiv=128, F3c=(13, 18, −3, −12, −1, 8, 1, −3, 0, 1, −1, 1). The coefficients of the sub-filters have been derived from an interpolation filter for obtaining an interpolated signal which is sampled of 8*Fs, designed with a Kaiser window with beta =4.5. The impulse response error is given in FIG. 12, in which the sync function waveform is the transfer characteristic of a Kaiser window with beta =4.5 and the waveform E represents an error magnified 100 times. The largest errors occur at δ=0, ¼, ½ and ¾. These are errors purely caused by quantisation of the coefficients. Although the coefficients of F4 are zero the attenuation is still substantially 60 dB. If the filter would be used only for 4*upsampling, F3 may also be dispensed with. The remainder, i.e. 11 delay sections and 17 8-bit coefficients plus some adders for the mixers, is substantially less complex than the filter in the IC SAA7220 (upsampling filter for CD audio) and, moreover, the attenuation is almost 10 dB better.

Summary: In order to improve the phase and frequency characteristics of the VPD filter the following steps are taken:

1. The differentiator is modified to obtain non-linear phase characteristics.

2. The sequence of the coefficients is reversed depending on the sign of the delay.

3. If required, additional differentiators with other control functions are added.

4. If desired, the control functions can be selected from a table.

In essence, in a method of delaying a time-discrete signal by a selectable fraction ($\delta$) of a sampling period of the time-discrete signal, first (F1) and second (F2) differential signals having mutually different phase characteristics are derived from the discrete signal and are subsequently combined (MIX) in dependence on the selectable fraction ($\delta$) to obtain a phase-adjusted correction signal. The product of the selectable fraction ($\delta$) and the correction signal is added to the time-discrete signal to obtain a time-discrete signal which has been delayed by the selectable fraction ($\delta$). The second differential signal (F2) is obtained by means of a differentiator with asymmetric coefficients in order to optimise the transfer characteristic for $\delta=0.5$.

In general, the VPD filter can be used for interpolation, sampling frequency conversion and as a variable delay for time-discrete signals. Specific examples are:

standard conversion for TV (aspect ratio conversion between 16/9 and 4/3 in PALplus, LCD and plasma displays);

line-locked colour decoder operating on single crystal clock;

ghost correction in TV;

conversion of DVB audio (various audio standards in Digital Video Broadcast) to one sampling frequency.

It is to be noted that the embodiments described above illustrate rather than limit the invention, and that those skilled in the art will be able to design many alternative embodiments, without departing from the scope of the appended Claims. For example, the time-discrete signal may either be amplitude-discrete, in which case it is a digital signal within the narrow meaning of that expression, or have a continuous amplitude.

I claim:

1. A non-integral delay circuit for delaying a time-discrete signal by a selectable fraction ($\delta$) of a sampling period of said time-discrete signal, comprising:

first means for differentiating said time-discrete signal to obtain a first differential signal (F1) having a first phase characteristic with respect to said time-discrete signal;

second means for differentiating said time-discrete signal to obtain a second differential signal (F2) having a second phase characteristic with respect to said time-discrete signal; said first and second phase characteristics differing from each other;

means for combining said first (F1) and second (F2) differential signals in dependence on said selectable fraction ($\delta$) to obtain a phase-adjusted correction signal;

means for adding a product of said selectable fraction ($\delta$) and said phase-adjusted correction signal to said time-discrete signal, to obtain said time-discrete signal delayed by said selectable fraction ($\delta$) of the sampling period of said time-discrete signal; wherein said second differentiating means include a differentiator with asymmetric coefficients and a sequence of differentiator coefficients is selected based on the sign of said selectable fraction ($\delta$).

2. A non-integral delay circuit for delaying a time-discrete signal by a selectable fraction ($\delta$) of a sampling period of said time-discrete signal, comprising:

first means for differentiating said time-discrete signal to obtain a first differential signal (F1) having a first phase characteristic with respect to said time-discrete signal;

second means for differentiating said time-discrete signal to obtain a second differential signal (F2) having a second phase characteristic with respect to said time-discrete signal; said first and second phase characteristics differing from each other;

means for combining said first (F1) and second (F2) differential signals in dependence on said selectable fraction ($\delta$) to obtain a phase-adjusted correction signal;

means for adding a product of said selectable fraction ($\delta$) and said phase-adjusted correction signal to said time-discrete signal, to obtain said time-discrete signal delayed by said selectable fraction ($\delta$) of the sampling period of said time-discrete signal; wherein said second differentiating means include a differentiator with asymmetric coefficients, and further differentiating means for differentiating said time-discrete signal to obtain at least one further differential signal (F3), the phase characteristics of said first, second and further differentiating means differing from one another, and wherein said combining means have an input coupled to said further differentiating means.

3. A non-integral delay circuit as claimed in claim 2, wherein said further differentiating means include means for multiplying the second differential signal (F2) by said fraction minus half the sampling period ($\delta$–0.5).

4. A non-integral delay circuit as claimed in claim 2, wherein said further differentiating means include third and fourth differentiating means for obtaining third (F3) and fourth (F4) differential signals whose phase characteristics are, respectively, dependent on said fraction minus half the sampling period ($\delta$–0.5) and the absolute value thereof (abs($\delta$–0.5)), and means for the combined supply of said second (F2), third (F3) and fourth (F4) differential signals to said input of said combining means.

5. A non-integral delay circuit as claimed in claim 2, wherein said further differentiating means are controlled by means of a memory circuit or multiplexer controlled in dependence on said fraction ($\delta$).

6. A method of delaying a digital signal by a selectable fraction ($\delta$) of a sampling period of said digital signal, which method comprises the following steps:

differentiating said digital signal to obtain a first differential signal (F1) having a first phase characteristic with respect to said digital signal;

differentiating said digital signal to obtain a second differential signal (F2) having a second phase characteristic with respect to said digital signal, said first and second phase characteristics differing from each other;

combining said first (F1) and second (F2) differential signals in dependence on said selectable fraction ($\delta$) to obtain a phase-adjusted correction signal; and adding a product of said selectable fraction (δ) and said phase-adjusted correction signal to said digital signal, to obtain said digital signal delayed by said selectable fraction (δ) of the sampling period of said digital signal; wherein said second differential signal (F2) is obtained by means of a differentiator with asymmetric coefficients and a sequence of differentiator coefficients is selected based on the sign of said selectable fraction (δ).

7. A delaying method as claimed in claim 6, wherein said digital signal is a time-discrete signal having an analog amplitude.

* * * * *